United States Patent [19]
Sievers et al.

[11] Patent Number: 4,970,093
[45] Date of Patent: Nov. 13, 1990

[54] CHEMICAL DEPOSITION METHODS USING SUPERCRITICAL FLUID SOLUTIONS

[75] Inventors: Robert E. Sievers; Brian N. Hansen, both of Boulder, Colo.

[73] Assignee: University of Colorado Foundation, Boulder, Colo.

[21] Appl. No.: 507,829

[22] Filed: Apr. 12, 1990

[51] Int. Cl.[5] .............................................. B05D 3/06
[52] U.S. Cl. ........................................ 427/38; 427/35; 427/45.1; 427/294; 427/314; 427/337; 427/377
[58] Field of Search .................. 427/35, 38, 45.1, 337, 427/377, 314, 294

[56] References Cited
U.S. PATENT DOCUMENTS
4,582,731 4/1986 Smith .................................. 427/421

OTHER PUBLICATIONS
Peterson et al., *Polymer Engineering and Science*, vol. 27, No. 22, pp. 1693–1697 (1987).
Matson et al., *Industrial and Engineering Chemical Research*, vol. 26, pp. 2298–2306 (1987).

*Primary Examiner*—Bernard Pianalto
*Attorney, Agent, or Firm*—Lowe, Price, LeBlance, Becker & Shur

[57] ABSTRACT

A method for depositing a film of a desired material on a substrate comprises dissolving at least one reagent in a supercritical fluid comprising at least one solvent. Either the reagent is capable of reacting with or is a precursor of a compound capable of reacting with the solvent to form the desired product, or at least one additional reagent is included in the supercritical solution and is capable of reacting with or is a precursor of a compound capable of reacting with the first reagent or with a compound derived from the first reagent to form the desired material. The supercritical solution is expanded to produce a vapor or aerosol and a chemical reaction is induced in the vapor or aerosol so that a film of the desired material resulting from the chemical reaction is deposited on the substrate surface. In an alternate embodiment, the supercritical solution containing at least one reagent is expanded to produce a vapor or aerosol which is then mixed with a gas containing at least one additional reagent. A chemical reaction is induced in the resulting mixture so that a film of the desired material is deposited.

24 Claims, 3 Drawing Sheets

CHEMICAL DEPOSITION METHODS USING SUPERCRITICAL FLUID SOLUTIONS

FIELD OF THE INVENTION

The present Invention relates to methods for chemically depositing a film of a desired material on a substrate using supercritical fluid solutions. The present methods combine supercritical fluid transport and chemical vapor deposition techniques and are particularly useful for forming films of superconductors, insulators, catalysts, protective coatings, optical films and the like.

BACKGROUND OF THE INVENTION

There are many chemical vapor deposition techniques available which may be used for the formation of thin films on a substrate surface. The use of two or more reagents in the chemical vapor deposition of films is often required, and the stoichiometric ratio of the reagents which are employed is a very important feature in the production of high-quality thin films. However, many chemical vapor deposition techniques use volatile and semivolatile reagents as starting materials which react in the vapor phase or at the substrate surface to form a thin film on the surface. When separate sources of volatile reagents are used, the stoichiometry and homogeneity of the reagents at the substrate surface are often hard to control owing to inadequate mixing of the reagents and/or variations in the reagent vapor pressure at the respective reagent reservoirs, temperature fluctuations and reagent decomposition. Other techniques for forming thin films, for example sputtering, laser evaporation and electron beam evaporation, use nonvolatile sources but are disadvantageous in that they are extremely slow and energy inefficient. Thus, a need exists for deposition techniques for forming thin films which allow improved control of reagent stoichiometry and homogeneity and which are relatively fast and energy efficient in use.

The use of supercritical fluid solutions in the formation of thin films, powders and fibers is also known. For example, the Smith U.S. Pat. No. 4,582,731 discloses methods for solid film deposition and fine powder formation by dissolving a solid material in a supercritical fluid solution at an elevated pressure and then rapidly expanding the solution through an orifice into a region of relatively low pressure. The Smith reference discloses only physical processes such as solvent evaporation to form films as contrasted with the chemical processes used in the present Invention as will be discussed in detail below. Similar methods are disclosed by Peterson et al., *Polymer Engineering and Science*, Vol. 27, No. 22, pp. 1693–1697 (1987), and Matson et al., *Industrial and Engineering Chemical Research*, Vol. 26, pp. 2298–2306 (1987). However, these methods are disadvantageous in that the deposited material must be soluble in the supercritical fluid. Thus, the previously known methods employing supercritical fluids do not solve the deficiencies of chemical vapor deposition methods noted above.

SUMMARY OF THE INVENTION

Accordingly, it is an object of the present Invention to provide improved methods for depositing films of a desired material on a substrate. It is a further object of the Invention to provide methods for depositing a film on a substrate by use of a combination of supercritical fluid and chemical vapor deposition techniques. It is an additional object of the Invention to provide methods for depositing films on a substrate, which methods employ nonvolatile or volatile reagents and allow improved control of the reagents during the deposition process. Another object of the present Invention is the provision of methods for depositing high quality films at high rates and while employing low temperatures in order to achieve little or no interdiffusion of the deposited film into the substrate or of the substrate material into the deposited film. It is a further object of the Invention to provide methods for depositing thin films of superconductors, insulators, catalysts, protective coatings, optical films and the like.

These and additional objects are provided by the methods of the present Invention for depositing films of a desired material on a substrate. The methods according to the present Invention comprise dissolving at least one reagent in a supercritical fluid comprising at least one solvent to form a supercritical solution. In one embodiment, at least one reagent is capable of reacting with or is a precursor of a compound capable of reacting with the solvent to form the desired material. In a second embodiment, the supercritical solution contains at least one additional reagent dissolved therein which is capable of reacting with or is a precursor of a compound capable of reacting with the first reagent or with a compound of which the first reagent is a precursor. The methods further include rapidly expanding the supercritical solution to produce a vapor or aerosol containing the first reagent, the solvent and any additional reagents dissolved in the supercritical solution, and inducing a chemical reaction in the vapor or aerosol at or near the substrate's surface and deposition of a film of the desired material resulting from the chemical reaction on the substrate surface. In a third embodiment, one or more reagents are dissolved in the supercritical fluid, the resulting supercritical solution is expanded, and the resulting vapor or aerosol is mixed with a gas containing one or more additional reagents before the chemical reaction is induced.

Thus, the methods of the present Invention employ supercritical fluid transport of the reagents or their precursors, followed by rapid expansion of the supercritical solution and chemical reaction at or near the substrate surface to deposit a solid film thereon. Any reagent which can chemically react or which is a precursor of a compound which can chemically react to form a desired material and which is soluble in a supercritical fluid may be used in the methods of the Invention. The use of the supercritical fluid allows precise control of the initial stoichiometry of the reagents employed in the present methods whereby films of high quality may be deposited. The methods of the Invention are also advantageous in providing high deposition rates and in effecting deposition of the desired material at relatively low temperatures which prevent interdiffusion between the deposited material and the substrate.

These and additional objects and advantages will be more fully understood in view of the following detailed description.

BRIEF DESCRIPTION OF THE DRAWING

The following detailed description will be better understood when viewed in connection with the drawing in which.

DETAILED DESCRIPTION

Figure 1:
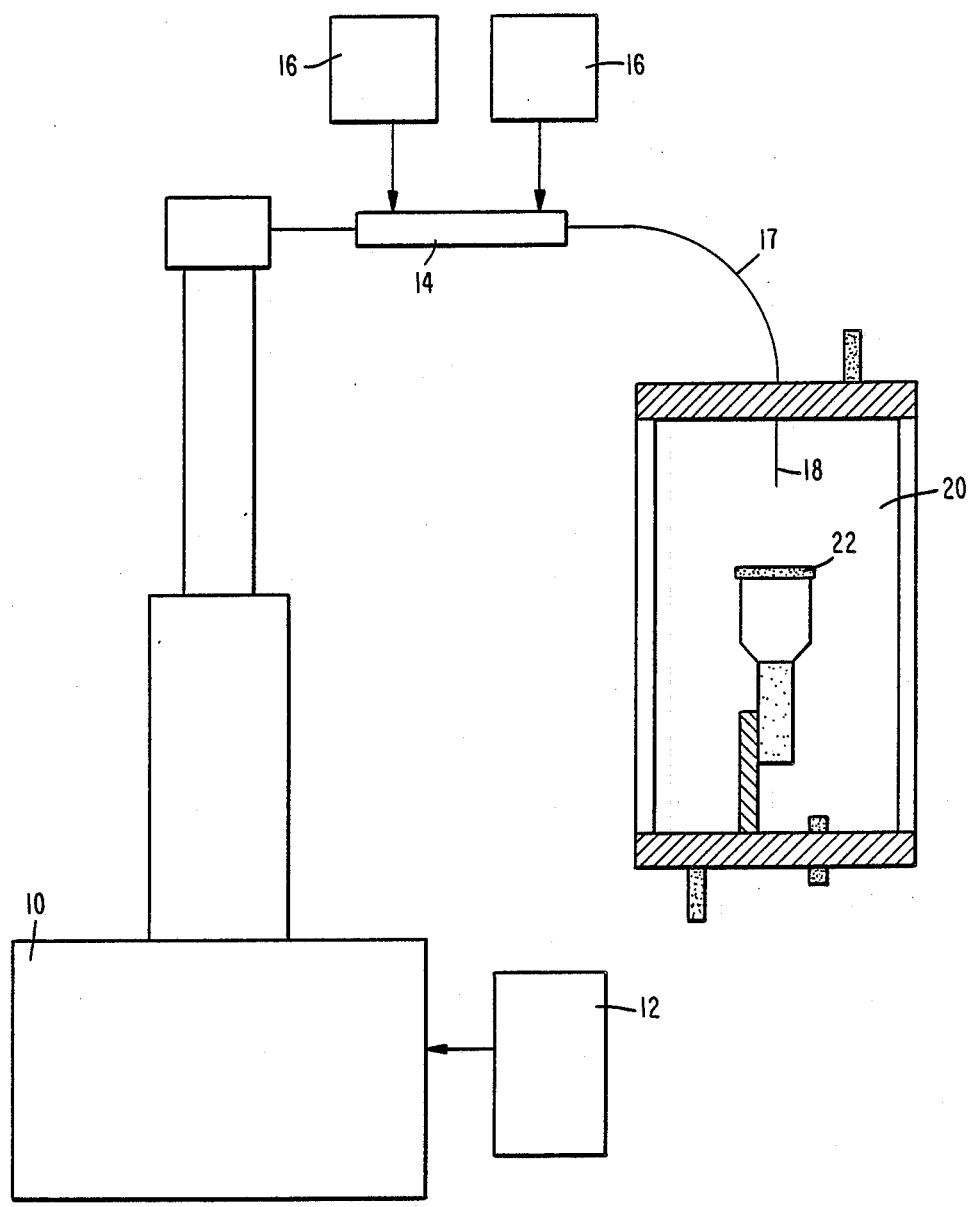
FIG. 1 represents a schematic diagram of a first apparatus suitable for use in the practice of the methods of the present Invention.

The methods according to the present Invention combine supercritical fluid transport and chemical vapor deposition techniques to chemically deposit a film of a desired material on a substrate surface. More particularly, the reagents, or the precursors thereof, for forming the desired material are transported to the substrate surface in a supercritical fluid solution. Use of the supercritical fluid allows precise control of the stoichiometry of the reagents or precursors thereof whereby the following chemical reaction produces a homogeneous, high quality film of deposited material. The supercritical solution is rapidly expanded to produce a vapor or aerosol containing the reactants, or precursors thereof, at or near the substrate surface so that the induced chemical reaction results in deposition of the desired film on the substrate surface. It is an important feature of the Invention that the reagents which are employed react to form the desired material which is deposited in the form of the film.

According to the present Invention, at least one reagent is dissolved in a supercritical fluid comprising at least one solvent to form the supercritical solution. Supercritical fluids are well known in the art and are generally referred to as dense gases wherein the saturated liquid and saturated vapor states are identical, Sonntag et al., *Introduction to Thermodynamics, Classical and Statistical*, 2nd ed., John Wiley & Sons, 1982, p. 40. Table 1 lists various supercritical solvents which, among others, are suitable for use in the present methods, together with the corresponding critical pressures, temperatures and densities of the solvents.

TABLE 1

Examples of Supercritical Solvents

| Compound | Boiling Point (°C.) | Temperature (°C.) | Critical Pressure (atm) | Critical Density (g/cm³) |
|---|---|---|---|---|
| $CO_2$ | −78.5 | 31.3 | 72.9 | 0.448 |
| $NH_3$ | −33.35 | 132.4 | 112.5 | 0.235 |
| $H_2O$ | 100.00 | 374.15 | 218.3 | 0.315 |
| $N_2O$ | −88.56 | 36.5 | 71.7 | 0.45 |
| Methane | −164.00 | −82.1 | 45.8 | 0.2 |
| Ethane | −88.63 | 32.28 | 48.1 | 0.203 |
| Ethylene | −103.7 | 9.21 | 49.7 | 0.218 |
| Propane | −42.1 | 96.67 | 41.9 | 0.217 |
| Pentane | 36.1 | 196.6 | 33.3 | 0.232 |
| Benzene | 80.1 | 288.9 | 48.3 | 0.302 |
| Methanol | 64.7 | 240.5 | 78.9 | 0.272 |
| Ethanol | 78.5 | 243.0 | 63.0 | 0.276 |
| Isopropanol | 82.5 | 235.3 | 47.0 | 0.273 |
| Isobutanol | 108.0 | 275.0 | 42.4 | 0.272 |
| Chlorotrifluoromethane | 31.2 | 28.0 | 38.7 | 0.579 |
| Monofluoromethane | 78.4 | 44.6 | 58.0 | 0.3 |
| Toluene | 110.6 | 320.0 | 40.6 | 0.292 |
| Pyridine | 115.5 | 347.0 | 55.6 | 0.312 |
| Cyclohexane | 80.74 | 280.0 | 40.2 | 0.273 |
| m-Cresol | 202.2 | 433.0 | 45.0 | 0.346 |
| Decalin | 195.65 | 391.0 | 25.8 | 0.254 |
| Cyclohexanol | 155.65 | 356.0 | 38.0 | 0.273 |
| o-Xylene | 144.4 | 357.0 | 35.0 | 0.284 |
| Tetralin | 207.57 | 446.0 | 34.7 | 0.309 |
| Aniline | 184.13 | 426.0 | 52.4 | 0.34 |

Selection of a suitable solvent for use in the present methods is an important feature. The solvent must expand rapidly with minimal droplet and molecular cluster formation in order to allow formation of a homogeneous, nongranular film of the deposited material. The solvent must also be compatible with the reagents dissolved therein. As will be discussed in further detail below, in some cases the solvent may be reactive with one or more reagents dissolved therein, or compounds derived from such reagents, in forming the desired material. It is also important that the reagents are sufficiently soluble in the supercritical fluid to allow homogeneous transport of the reagents and rapid formation of a film on a substrate once the supercritical solution is expanded. Solubility is dependent upon temperature, pressure and composition of the supercritical solvent. Generally, the relationship between solubility and density is simple, with the solubility being approximately proportional to the solvent density for a particular solvent. However, the relationships between solubility and temperature and pressure are more complicated. That is, when the fluid is near the critical temperature, small variations in the pressure can create large variations in density and solubility. Near the critical pressure, most solvents exhibit a decreased solubility with increasing temperature since the density of the solvent is reduced with increased temperature. Additionally, if the solvent temperature increases where the solute vapor pressure becomes significant, then the solubility may increase.

Many reagents which could be useful in chemical vapor deposition are insoluble or only slightly soluble in various liquids and gases. However, the same reagents often exhibit increased solubility in supercritical fluids. Thus, a wider range of reagents may be employed in the methods of the present Invention as compared with conventional chemical vapor deposition techniques because of the high solvating power of supercritical fluids. Supercritical fluids which have critical temperatures near room temperature (25° C.) are particularly suitable for use as solvents for reagents which are unstable at higher temperatures. While many supercritical fluids which have critical temperatures near room temperature are relatively nonpolar and therefore by themselves are only useful for dissolving nonpolar compounds, this limitation may be overcome in several ways in the methods of the present Invention. For example, polar modifiers such as methanol may be added to the supercritical solvent in order to increase its polarity. Alternatively, nonpolar compounds which are precursors for reactive compounds may be employed as the reagents. For example, organometallic compounds are precursors for metal-containing deposits and have been found to be particularly suitable for depositing metal oxide ceramic films and other metal-containing films in the methods of the present Invention. The organometallic compounds and metallo-organic complexes are an important source of metal-containing reagents since most inorganic metal-containing salts are ionic and very insoluble, even in modified supercritical fluids.

In accordance with the present methods, at least one reagent is dissolved in the supercritical fluid comprising at least one solvent to form the supercritical solution. In one embodiment of the present methods, the reagent is capable of reacting with or is a precursor of a compound capable of reacting with the solvent to form the desired material. For example, when the supercritical fluid comprises nitrous oxide and the reagent comprises one or more metal precursors, the nitrous oxide not only transports the metal precursors to the substrate in precise stoichiometric ratios, but also can serve as an oxidizing agent for the organometallic compounds to form deposited films of ceramic metal oxides. For example, excitation of $N_2O$ by plasma generation increases the oxidizing power of the solvent in the deposition chamber. Other examples of chemically reactive supercritical fluids include carbon dioxide which can react with metal precursors to form metal carbonates, and water which may react with various reagents to form oxide and/or hydroxide containing films.

In an alternate embodiment of the present methods, the reagent does not react with the supercritical fluid solvent to form the desired material. However, in this embodiment, the supercritical solution contains at least one additional reagent dissolved therein which is capable of reacting with or is a precursor of a compound capable of reacting with the first reagent, or a compound derived from the first reagent, to form the desired material. For example, two or more organometallic compounds which are precursors of metal reactants which form metal oxide compounds may be dissolved in an inert supercritical fluid such as pentane, and a chemical reaction is induced between the organometallic compounds once the supercritical solution has been expanded in order to deposit the desired film. The pentane supercritical fluid solvent allows precise control of the stoichiometric ratios of organometallic compounds in the methods of the present Invention in order to provide high quality films.

In either of these embodiments, wherein the reagent reacts with the supercritical fluid solvent or wherein an additional reagent is dissolved in the supercritical solution, one or more catalyst compounds may also be dissolved in the supercritical fluid or may be added to the reaction system at or near the substrate surface. As will be apparent to one of ordinary skill in the art, various catalyst compounds may be employed in this manner.

In accordance with the present methods, the supercritical solution is rapidly expanded to produce a vapor or aerosol containing the reagent, the solvent and any additional reagents dissolved in the supercritical solution. In a preferred embodiment, the supercritical solution is rapidly expanded by passing the solution through a restrictor orifice or nozzle in accordance with methods known in the art. In a first preferred embodiment, the restrictor orifice comprises a capillary fused silica tubing member having an internal diameter in the range of about five to about 50 microns and a length in the range of about 1 to about 10 cm. In a second preferred embodiment, the restrictor orifice comprises a laser-drilled foil restrictor in which the orifice diameter is approximately 1 to 10 microns and the orifice length (foil thickness) is from about 0.1 to about 1 mm. When the solution is discharged from the orifice, the solution is substantially vaporized creating individual molecules or small clusters of the reagents and solvent. The components of the vapor or very fine aerosol can rapidly participate in chemical reactions at or near the substrate surface to form the desired film.

In a third embodiment of the present Invention, at least one reagent is dissolved in the supercritical fluid comprising at least one solvent to form the supercritical solution. The supercritical solution is rapidly expanded to produce a vapor or aerosol containing the reagent, the solvent and any additional reagents dissolved in the supercritical solution. This vapor is then mixed with a gas containing one or more additional reagents. The reagent contained in the supercritical solution is capable of reacting with or is a precursor of a compound capable of reacting with the at least one additional reagent contained in the gas or with a compound derived from the one or more additional reagents, to form the desired material. The reagents contained in the resulting mixture can rapidly participate in chemical reactions at or near the substrate surface to form the desired film.

The chemical reaction and film deposition may be induced in a number of ways as will be apparent to one skilled in the art. The chemical reaction and film deposition may be induced by oxidation or reduction of at least one component of the vapor or aerosol, for example wherein the reagent is oxidized or reduced by the solvent or by at least one additional reagent dissolved in the supercritical fluid solution. Alternatively, the chemical reaction and film deposition may be induced by thermal decomposition of at least one component of the vapor or aerosol, for example where the vapor or aerosol and/or the substrate on which the film is deposited are heated to elevated temperatures. In other embodiments, the chemical reaction and film deposition are induced by hydrolysis of at least one component of the vapor or aerosol, by irradiating the vapor or aerosol, or at least one component thereof, with electromagnetic radiation, or by ionization of at least one component of the vapor or aerosol. Suitable ionization means are well known in the art and may comprise, among others, electromagnetic radiation, electron impact or chemical means. Additionally, the chemical reaction and film deposition may be induced by passing the vapor or aerosol through a plasma, for example generated by direct current, radio frequency or microwave discharge. Ultraviolet photolysis may also be used to induce the chemical reaction and film deposition in accordance with the present methods. Many of these means for inducing the chemical reaction and film deposition also serve to break up molecular clusters which may form in the vapor or aerosol.

FIG. 1 discloses an apparatus suitable for use in performing the present methods. With reference to FIG. 1, the apparatus includes a supercritical fluid pump 10 which pressurizes the supercritical fluid solvent supplied from a solvent reservoir 12. The apparatus further includes a solution reservoir 14 which is supplied with the supercritical solvent from the supercritical fluid pump 10 and with one or more reagents from reagent reservoirs 16. The solution reservoir 14 is connected to a line 17 which delivers the supercritical fluid solution to a restrictor orifice 18 for rapidly expanding the supercritical fluid solution in a deposition chamber 20. In the deposition chamber 20, the substrate 22 which receives the deposited film is arranged in the vicinity of the restrictor orifice.

Use of the apparatus set forth in FIG. 1 in practicing the methods of the present Invention is as follows. A suitable solvent from the solvent reservoir 12 is supplied to the supercritical fluid pump 10 where it is pressurized. Additionally, one or more reagents from reagent reservoir 16 are provided to the solution reservoir 14 in the proper stoichiometric amounts for forming, or to provide compounds for forming, the film of the desired material. Owing to the precise stoichiometric ratio control provided by the present methods, films of high quality may be produced. The solution reservoir is then pressurized with pressurized solvent from the supercritical fluid pump 10, and the contents of the solution reservoir 14 are heated (by means not shown) above the critical temperature of the solvent to form a supercritical solution. The supercritical solution is then directed via line 16 to the restrictor orifice 18 comprising, for example, a fused silica capillary restrictor which maintains the pressure in the solution reservoir 14. When the supercritical solution is discharged through the restrictor orifice, the solution is rapidly expanded and a vapor or very fine aerosol is produced creating individual molecules or small clusters of the reagents and solvent. The components of the vapor or aerosol can rapidly participate in chemical reactions at or near the substrate surface 22 and deposit the desired film.

In an alternative embodiment, one or more reagents which are soluble in the supercritical fluid may be melted together in the appropriate stoichiometry for forming the desired film, and the resulting melt may then be solidified. The solidified melt is then placed in the solution reservoir 14 where it will dissolve in the supercritical fluid and release the reagents in the appropriate stoichiometry to form the supercritical solution.

Various process conditions may be controlled to vary the deposition rate or the quality, i.e. the physical characteristics, of the deposited film. For example, the flow rate of the supercritical solution through the restrictor nozzle and/or the pressure of the supercritical fluid solution may be varied in order to change the deposition rate or the quality of the deposited film. The temperature of the substrate or the deposition chamber may also be varied in order to vary the deposition rate or the quality of the deposited film. Additionally, the solute concentrations may be varied in order to change the deposition rate and/or the quality of the deposited film. Varying the temperature of the supercritical fluid solution may also change the solubility of the reagents and thereby affect the deposition rate. In this regard, varying the solution pressure may also affect the solubility of the reagents in the solution. The pressure in the discharge chamber may also be varied in order to affect the granularity of the deposited film.

In use of the described apparatus, a problem may be incurred if additional solvent moves into the solution reservoir and dilutes the solution of reagents, for example metal chelates, to an undesirable degree. This problem may be overcome in several manners. For example, in the formation of mixed metal compounds, a metal chelate polymer containing the desired metals in the correct stoichiometric ratio could be used as a reagent precursor compound. If the polymer is only slightly soluble in the supercritical fluid solvent and the solution is maintained at a saturated concentration, the concentration of the chelate polymer will remain constant until substantially all the polymer is dissolved. In this regard, it is noted that the solubility of the polymer can be easily changed by varying the temperature and/or pressure of the supercritical fluid. Alternatively, metal chelates which serve as precursors for the metals forming a mixed metal oxide film may be dissolved in a liquid solvent such as methanol which serves as a modifier to increase the solubility of the chelates in a supercritical fluid solvent. The methanol solution may then be mixed with the supercritical fluid solvent using, for example, a high pressure liquid chromatography metering pump which has a very constant flow rate. This alternative retains the advantages of the methods of the present Invention in that the methanol solution is mixed with the supercritical fluid solvent which produces smaller and more consistent vapor or aerosol particles than are formed by evaporation of an ordinary liquid.

Figure 2:
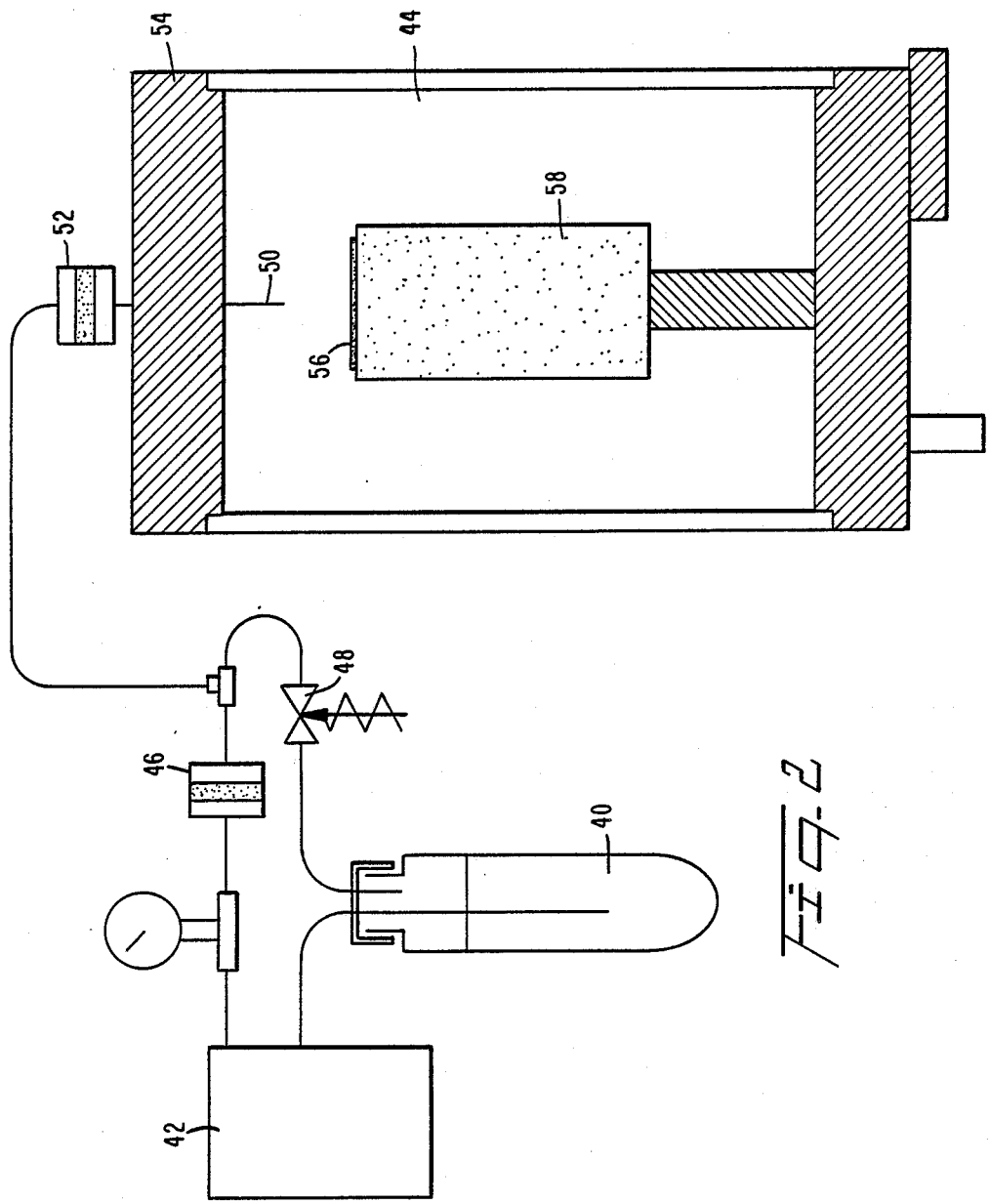
FIG. 2 represents a schematic diagram of a second apparatus suitable for use in the practice of the methods of the present Invention.

In a third embodiment, the metal chelates or other reagents may be dissolved in a liquid which is then pressurized above the critical pressure and is pumped to a heated conduit or restrictor above the critical temperature. N-pentane is a particularly suitable solvent for use in this embodiment since it is liquid at room temperature, but the critical temperature is low enough to use thermally unstable reagents. Additionally, Y, Ba and Cu chelates such as $Y(thd)_3$, $Ba(thd)_2$ and $Cu(thd)_3$, tetramethylheptanedione chelates, are sufficiently soluble in n-pentane to successfully practice the present methods in the formation of Y-Ba-Cu-O thin films. FIG. 2 sets forth a schematic diagram of an apparatus suitable for use in this embodiment. With reference to FIG. 2, a liquid solution reservoir 40 is provided for supplying a liquid solution of one or more reagents dissolved therein. The liquid solution is pressurized above its critical pressure and is pumped to the deposition chamber 44 by means of a supercritical fluid pump 42. The liquid solution may be continuously recirculated through a particle filter 46 and a pressure regulator 48. The pressure regulator maintains a constant pressure above the critical pressure at the restrictor 50 and allows excess solution to return to the solution reservoir. An additional particle filter 52 may be provided in the supply line and a restrictor heater 54 may be included if desired. The deposition chamber is supplied with a substrate 56 and optionally a heater 58.

In a preferred embodiment of the Invention, deposited films formed according to the present methods may be further oxidized by exposure to an oxidizing agent, an oxidizing plasma or the like while in the deposition chamber. Additionally, the deposited film may be exposed to water vapor at an elevated temperature. As will be apparent to one of skill in the art, the extent of such an oxidizing treatment will depend on the desired properties and intended applications of the deposited films.

The methods according to the present Invention are useful for forming thin films for use in a number of applications. For example, the present methods may be used to provide thin metallic films of various compositions, including among others thin films of copper for electronic devices, thin films of tungsten for use in x-ray machine targets and the like. Various mixed metal oxide thin films may also be produced according to the present Invention for use in various applications including gas detectors, thermal insulators, electrical insulators and the like. In a preferred embodiment, the methods according to the present Invention provide thin films of mixed metal oxide high temperature superconducting compounds. Thin films of superconducting compounds produced by the present methods may have many important applications, including use in superconducting quantum interference devices, superconducting interconnects and gates in electronic circuits and devices, superconducting power transmission lines, and the like.

Most of the known techniques for making thin film superconductors use at least three separate sources of metals and require a post annealing step in order to insert oxygen into the resulting material. When three separate source gases of, for example, Y-, Ba-and Cu-containing organometallic compounds, such as $\beta$-diketonate metal chelates of the metals, contact a high substrate in the presence of oxygen or water, the compounds react to produce a thin film superconductor by chemical vapor deposition. This method is described in detail in the compending Sievers U.S. patent application Ser. No. 07/134,251 which is incorporated herein by reference. However, it is difficult to precisely control the rate of delivery of each organometallic compound from three separate metal sources in the correct stoichiometry to form a high quality superconductor. The methods of the present Invention overcome this problem and allow all three organometallic compounds to be dissolved in the desired proportions in one solvent, namely the supercritical fluid, from which an aerosol vapor is formed. Thus, according to the present methods, the stoichiometry may be precisely controlled in forming the desired film. This is an important advantage over known processes for forming mixed metal oxide materials. In this regard, it is noted that precise control of the stoichiometric ratio of the metals is desirable not only for preparing thin films of superconductors but also in various other materials and applications.

In the formation of Y-Ba-Cu-O thin films using the methods of the present Invention, the use of nonaqueous $N_2O$ or $CO_2$ as the supercritical fluid solvent and $\beta$-diketonate metal complexes as the reagents is advantageous. Nonaqueous solutions of supercritical $N_2O$ and $CO_2$ are advantageous for use in that the concentration of water vapor which can cause surface corrosion of a deposited film is reduced. The use of supercritical $N_2O$ rather than $CO_2$ also reduces the amount of $CO_2$ which reacts with Barium(II) to form $BaCO_3$. Trace amounts of $BaCO_3$ at the crystal grain boundaries can reduce the critical current, and therefore the presence of $CO_2$ requires a higher processing temperature to decompose $BaCO_3$ impurities. Additionally, $N_2O$ is a strong oxidizing agent which can adequately oxidize the $\beta$-diketonate metal complexes at elevated temperatures without further addition of oxygen. Also, because $N_2O$ is a slightly polar supercritical fluid, it may provide better dissolution of polar nonvolatile chelates like the citrate and EDTA metal complexes which are easy to synthesize and polymerize.

In the preparation of Y-Ba-Cu-O superconducting films using the present methods, plasma-assisted techniques have produced high quality films at temperatures of about 400° C., without the use of post annealing techniques. This low temperature deposition is extremely advantageous in forming films for use in the electronics industry, since it allows the use of semiconductor substrates such as silicon without causing interdiffusion between the silicon and the deposited superconducting films. In a further embodiment of the present methods, the vapor or aerosol which results from the rapid expansion of the supercritical fluid solution is passed through a microwave or radio frequency-induced plasma discharge in the presence of excess oxygen to induce the chemical reaction and deposition of the film. The excess oxygen ensures complete decomposition of the chelates and production of oxygen, for example $O_2$ $O^+$ and/or $O^-$, ions. The plasma also creates ions containing Y, Ba and Cu, for example $Y(thd)_2$ and the like, which react and result in deposition of the desired film.

The methods of the present Invention are illustrated by the following examples.

EXAMPLE 1

In this example, a mixed metal oxide film of Y, Ba and Cu was produced using a method of the present invention and an apparatus as generally set forth in the Figure. More specifically, metal complexes of $Y(thd)_3$, $Ba(thd)_2$ or $Ba_5(thd)_9(H_2O)_3(OH)$, and $Cu(thd)_3$ were dissolved in n-pentane in a concentration of 1.00, 2.00, and 3.00 mmolar, respectively, to form a solution having the stoichiometric ratio of 1Y:2Ba:3Cu. The metal chelate solution was pressurized to 1400 psi using a Milton Roy high pressure liquid chromatography pump. The solution was heated to 210° C. and discharged through a 2.5 cm long capillary fused silica restrictor having an inside diameter of 25 $\mu$m. The solution was discharged into a deposition region having a pressure of about 200 $\mu$m of Hg. The metal chelates decomposed at or near the substrate surface which was heated to 700° C. to form a metallic mirror-like film of Y, Ba, and Cu. When the film was viewed under an electron microscope, it showed no visible granularity at a magnification of 10,000. The atomic ratios of Y, Ba, and Cu were found to be 1.0Y:1.8Ba:4.2Cu using x-ray emission spectroscopy. The Y and Ba x-ray emission bands were obscured by the strong Si emission because the film was very thin. This could explain the apparent measurement discrepancy relative to the ideal copper ratio of 3Cu.

EXAMPLE 2

A film was prepared in the same manner in Example 1 followed by oxidation of the deposited film with an oxygen plasma for 1 hour at 700° C. and a pressure of 200 $\mu$m Hg. The film exhibited a drop in resistance at the superconducting temperature similar to that found in very thick bulk superconductors of $YBa_2Cu_3O_{7-x}$.

EXAMPLE 3

Figure 3:
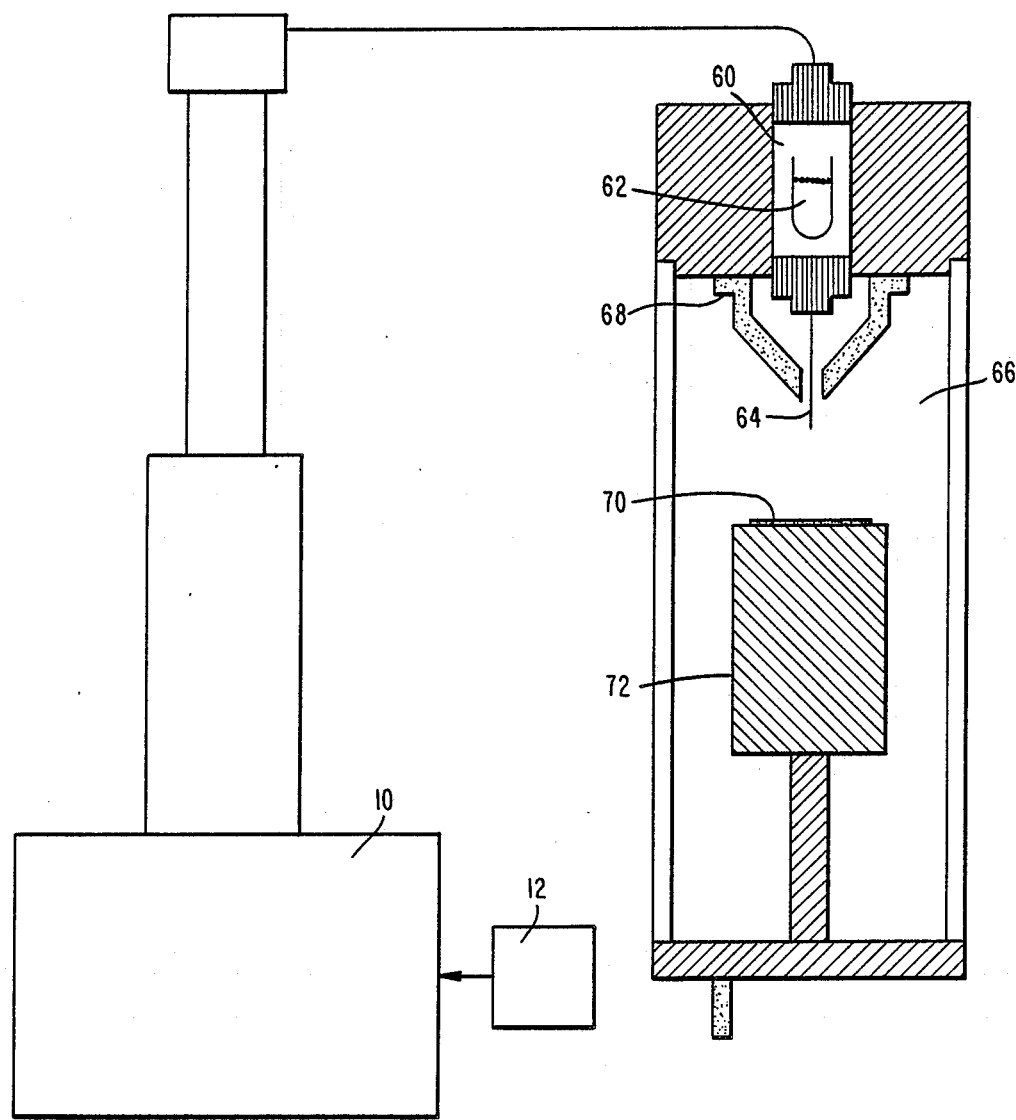
FIG. 3 represents a schematic diagram of a third apparatus suitable for use in practice of the methods of the present Invention.

In this example, an apparatus as shown schematically in FIG. 3 was employed. With reference to FIG. 3, solid from a reservoir 12 is supplied to a supercritical fluid pump 10 which pressurizes the supercritical fluid. The supercritical fluid is then supplied to a solution cell 60 which contains a mixture of the reagents in the form of a solidified melt 62. As the supercritical fluid passes through the solution cell 60, a portion of the solidified melt 62 dissolves in the supercritical fluid thereby producing the supercritical solution of reagents. The supercritical solution is passed through a restrictor nozzle 64 and into the deposition chamber 66. The restrictor nozzle 64 is provided with a protector 68. The deposition chamber 66 includes a substrate 70 arranged on a heating means 72. The apparatus shown in FIG. 3 requires no heated solution transfer line and the restrictor protector serves to maintain the restrictor at a constant temperature, thereby minimizing thermal transfer problems such as radiant heating by the substrate heater. Using the apparatus of FIG. 3, a metallic yttrium film was prepared by allowing a solidified melt of $Y(thd)_3$ to slowly dissolve supercritical $N_2O$ to form a solution which was discharged into the deposition region. The solution was discharged at 140° C. through the restrictor. The induced chemical reaction resulted in the deposition of a yttrium film on a silicon substrate heated at a temperature of 687° C. X-ray emission micrographs of the deposited film showed that the yttrium was distributed very uniformly with no visible clustering or discontinuities.

EXAMPLE 4

In this example, a thin film was deposited using the apparatus described in Example 3 with the exception that an infrared heater was used to heat the substrate while the supercritical fluid solution was expanded into a radio frequency induced plasma (13.5 MHz, 350-watt) in the deposition chamber maintained at 1 Torr pressure with a vacuum pump. The solidified melt contained a fused mixture of $Y(thd)_3$, $Ba_5(thd)_9(H_2O)_3(OH)$ and $Cu(thd)_2$ having the stoichiometric ratio of 1Y, 2Ba, 3Cu. The solidified melt was gradually dissolved in supercritical $N_2O$ to form a solution which was discharged into the plasma to form a mixed metal oxide film containing yttrium, barium and copper on a silicon substrate which was heated to about 500° C. with the infrared heater.

The preceding examples are set forth to illustrate specific embodiments of the Invention and are not intended to limit the methods of the present Invention. Additional embodiments and advantages within the scope of the claimed Invention will be apparent to one of ordinary skill in the art.

What is claimed is:

1. A method for depositing a film of a desired material on a substrate, comprising the steps of:
    (a) dissolving at least one reagent in a supercritical fluid comprising at least one solvent to form a supercritical solution, wherein said at least one reagent is capable of reacting with or is a precursor of a compound capable of reacting with said solvent to form the desired material or wherein said supercritical solution contains at least one additional reagent dissolved therein which is capable of reacting with or is a precursor of a compound capable of reacting with said at least one reagent or with a compound of which said at least one reagent is a precursor to form the desired material;
    (b) rapidly expanding the supercritical solution to produce a vapor or aerosol containing said at least one reagent, said at least one solvent and any additional reagents dissolved in the supercritical solution; and
    (c) inducing a chemical reaction in said vapor or aerosol at or near the substrate surface and deposition of a film of the desired material resulting from the chemical reaction on the substrate surface.

2. A method as defined by claim 1, wherein said at least one reagent or a compound derived therefrom reacts with said at least one solvent to form the desired material.

3. A method as defined by claim 1, wherein said at least one additional reagent is dissolved in said supercritical fluid and the at least one additional reagent or a compound derived therefrom, reacts with said at least one reagent or a compound derived therefrom to form the desired material.

4. A method as defined by claim 1, wherein the supercritical solution is rapidly expanded by passing through a restrictor orifice.

5. A method as defined by claim 4, wherein the rapidly expanded supercritical solution is in the form of a vapor.

6. A method as defined by claim 4, wherein the rapidly expanded supercritical solution is in the form of an aerosol.

7. A method as defined by claim 1, wherein the chemical reaction and film deposition are induced by oxidation or reduction of at least one component of said vapor or aerosol.

8. A method as defined by claim 7, wherein said at least one reagent is oxidized or reduced by said at least one solvent.

9. A method as defined by claim 7, wherein said at least one reagent is oxidized or reduced by said at least one additional reagent.

10. A method as defined by claim 1, wherein the chemical reaction and film deposition are reduced by thermal decomposition of at least one component of said vapor or aerosol.

11. A method as defined by claim 1, wherein the chemical reaction and film deposition are induced by hydrolysis of at least one component of said vapor or aerosol.

12. A method as defined by claim 1, wherein the chemical reaction and film deposition are induced by irradiating at least one component of said vapor or aerosol with electromagnetic radiation.

13. A method as defined by claim 1, wherein the chemical reaction and film deposition are induced by ionization of at least one component of said vapor or aerosol.

14. A method as defined by claim 13, wherein the ionization is effected by electromagnetic radiation, electron impact or chemical means.

15. A method as defined by claim 1, wherein the chemical reaction and film deposition are induced by passing said vapor or aerosol through a plasma.

16. A method as defined by claim 15, wherein the plasma is generated by direct current, by radio frequency or by microwave discharge.

17. A method as defined by claim 1, including the further step of exposing the deposited film to an oxidizing agent.

18. A method as defined by claim 1, including the further step of exposing the deposited film to an oxidizing plasma.

19. A method as defined by claim 1, including the further step of exposing the deposited film to water vapor at an elevated temperature.

20. A method as defined by claim 1, wherein the supercritical fluid comprises n-pentane.

21. A method as defined by claim 20, wherein the supercritical solution comprises $Y(thd)_3$, $Ba(thd)_2$ and $Cu(thd)_3$ dissolved in n-pentane.

22. A method as defined by claim 1, wherein the rate of film deposition is varied by varying the temperature of the substrate or of a deposition chamber in which the substrate is arranged.

23. A method as defined by claim 1, wherein the physical characteristics of the deposited film are varied by varying the temperature of the substrate or of a deposition chamber in which the substrate is arranged.

24. A method for depositing a film of a desired material on a substrate, comprising the steps of:
    (a) dissolving at least one reagent in a supercritical fluid comprising at least one solvent to form a supercritical solution;
    (b) rapidly expanding the supercritical solution to produce a vapor or aerosol containing said at least one reagent and said at least one solvent;

(c) mixing said vapor or aerosol with a gas containing at least one additional reagent dissolved therein which is capable of reacting with or is a precursor of a compound capable of reacting with said at least one reagent or with a compound of which said at least one reagent is a precursor to form the desired material; and (d) inducing a chemical reaction in the resulting mixture at or near the substrate surface and deposition of a film of the desired material resulting from the chemical reaction on the substrate surface.

* * * * *